United States Patent
Chen

(10) Patent No.: US 11,442,440 B1
(45) Date of Patent: Sep. 13, 2022

(54) METHOD AND APPARATUS OF HANDLING CONTROL WAFER, METHOD OF TESTING BY USING CONTROL WAFER

(71) Applicant: CHANGXIN MEMORY TECHNOLOGIES, INC., Hefei (CN)

(72) Inventor: San-Chen Chen, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 0 days.

(21) Appl. No.: 17/656,078

(22) Filed: Mar. 23, 2022

Related U.S. Application Data

(63) Continuation of application No. PCT/CN2021/120408, filed on Sep. 24, 2021.

(30) Foreign Application Priority Data

Mar. 24, 2021 (CN) .......................... 202110312426.0

(51) Int. Cl.
*G05B 19/418* (2006.01)
*H01L 21/67* (2006.01)
*H01L 21/68* (2006.01)

(52) U.S. Cl.
CPC ............. *G05B 19/4189* (2013.01); *G05B 2219/45031* (2013.01); *H01L 21/67* (2013.01); *H01L 21/68* (2013.01)

(58) Field of Classification Search
CPC ...... G05B 19/4189; G05B 2219/45031; H01L 21/67; H01L 21/68
See application file for complete search history.

(56) References Cited

U.S. PATENT DOCUMENTS

| 5,975,740 | A | * | 11/1999 | Lin | ............... | H01L 21/67745 |
| | | | | | | 700/121 |
| 6,303,398 | B1 | * | 10/2001 | Goerigk | ............. | G01R 31/2887 |
| | | | | | | 438/15 |
| 7,925,380 | B2 | | 4/2011 | Yu et al. | | |
| 11,121,104 | B2 | * | 9/2021 | Chen | ............... | H01L 24/03 |

(Continued)

FOREIGN PATENT DOCUMENTS

| CN | 101109932 A | 1/2008 |
| CN | 106158696 B | 12/2018 |

(Continued)

OTHER PUBLICATIONS

International Search Report and English Translation cited in PCT/CN2021/120408 mailed Dec. 29, 2021, 11 pages.

(Continued)

*Primary Examiner* — Ronald D Hartman, Jr.
(74) *Attorney, Agent, or Firm* — Cooper Legal Group, LLC

(57) ABSTRACT

The present disclosure provides a method and an apparatus of handling a control wafer, a method of testing by using a control wafer, a computer-readable storage medium and an electronic device, and relates to the technical field of semiconductor equipment. The method of handling a control wafer includes: setting different identification numbers for multiple reaction chambers; determining slot numbers of control wafers according to the identification numbers of the reaction chambers; and distributing the control wafers according to the slot numbers of the control wafers and the identification numbers of the reaction chambers.

18 Claims, 5 Drawing Sheets

(56) References Cited

U.S. PATENT DOCUMENTS

| | | | |
|---|---|---|---|
| 11,171,065 B2 | 11/2021 | Lin et al. | |
| 2003/0029383 A1 | 2/2003 | Ward et al. | |
| 2004/0193301 A1 | 9/2004 | Chao et al. | |
| 2007/0099310 A1* | 5/2007 | Vepa | H01L 21/67288 |
| | | | 702/108 |
| 2009/0078197 A1* | 3/2009 | Takenaga | H01L 21/67276 |
| | | | 700/121 |
| 2013/0102159 A1* | 4/2013 | Kotani | H01L 21/67276 |
| | | | 118/712 |
| 2019/0189490 A1* | 6/2019 | Morita | H01L 21/68771 |
| 2022/0068682 A1* | 3/2022 | Yamaguchi | H01L 21/67703 |

FOREIGN PATENT DOCUMENTS

| | | | | |
|---|---|---|---|---|
| CN | 109326536 A | | 2/2019 | |
| CN | 110164803 A | | 8/2019 | |
| CN | 110429045 A | | 11/2019 | |
| CN | 111933541 A | | 11/2020 | |
| CN | 112349616 A | * | 2/2021 | H01L 21/67011 |
| CN | 112349616 A | | 2/2021 | |

OTHER PUBLICATIONS

Written Opinion and English Translation cited in PCT/CN2021/120408 mailed Dec. 29, 2021, 6 pages.

\* cited by examiner

Control Wafer Distribution Interface — 300

Automatic Distribution | Manual Distribution

| ☐ Select All | Control Wafer | Identification Number | Reaction Chamber | | | | | | Whether to Appoint |
|---|---|---|---|---|---|---|---|---|---|
| ☐ | SN1 | | C1 | C2 | C3 | C4 | C5 | C6 | Yes No |
| ☐ | SN2 | | C1 | C2 | C3 | C4 | C5 | C6 | Yes No |
| ☐ | SN3 | | C1 | C2 | C3 | C4 | C5 | C6 | Yes No |
| ☐ | SN4 | | C1 | C2 | C3 | C4 | C5 | C6 | Yes No |
| ☐ | SN5 | | C1 | C2 | C3 | C4 | C5 | C6 | Yes No |
| ☐ | SN6 | | C1 | C2 | C3 | C4 | C5 | C6 | Yes No |
| ☐ | ... | | C1 | C2 | C3 | C4 | C5 | C6 | Yes No |
| ☐ | SN25 | | C1 | C2 | C3 | C4 | C5 | C6 | Yes No |

FIG. 3

Control Wafer Distribution Interface — 400

Automatic Distribution | Manual Distribution

| ☐ Select All | Control Wafer | Identification Number | Reaction Chamber | | | | | | Whether to Appoint |
|---|---|---|---|---|---|---|---|---|---|
| ☐ | SN1 | 2 | | C2 | | | | | Yes No |
| ☐ | SN2 | 2 | | C2 | | | | | Yes No |
| ☐ | SN3 | 2 | | C2 | | | | | Yes No |
| ☐ | SN4 | 2 | | C2 | | | | | Yes No |
| ☐ | SN5 | 2 | | C2 | | | | | Yes No |
| ☐ | SN6 | | C1 | | C3 | C4 | C5 | C6 | Yes No |
| ☐ | ... | | C1 | | C3 | C4 | C5 | C6 | Yes No |
| ☐ | SN25 | | C1 | | C3 | C4 | C5 | C6 | Yes No |

METHOD AND APPARATUS OF HANDLING CONTROL WAFER, METHOD OF TESTING BY USING CONTROL WAFER

CROSS-REFERENCE TO RELATED APPLICATIONS

This is a continuation of International Patent Application No. PCT/CN2021/120408, filed on Sep. 24, 2021, which claims the priority to Chinese Patent Application No. 202110312426.0, titled "METHOD AND APPARATUS OF HANDLING CONTROL WAFER, METHOD OF TESTING BY USING CONTROL WAFER, COMPUTER-READABLE STORAGE MEDIUM AND ELECTRONIC DEVICE" and filed on Mar. 24, 2021. The entire contents of International Patent Application No. PCT/CN2021/120408 and Chinese Patent Application No. 202110312426.0 are incorporated herein by reference.

TECHNICAL FIELD

The present disclosure relates to the technical field of semiconductor equipment, and in particular to a method and an apparatus of handling a control wafer, a method of testing by using a control wafer, a computer-readable storage medium and an electronic device.

BACKGROUND

In the manufacturing process of semiconductor wafers, it is necessary to monitor the stability of the semiconductor processing equipment. Usually, multiple control wafers are provided for the semiconductor processing equipment for corresponding processes, and processing results are obtained to determine whether the products fabricated by the semiconductor processing equipment satisfy process requirements.

The semiconductor processing equipment is often provided with multiple reaction chambers. The reaction chambers are usually distributed with different control wafers for processing, so as to realize the monitoring and management of each of the reaction chambers.

At present, the distribution of the control wafers to different reaction chambers is mainly carried out by means of manual setting and recording, which consumes manpower and time, and is prone to errors that affect the test results.

It should be noted that the information disclosed above is merely intended to facilitate a better understanding of the background of the present disclosure, and therefore may include information that does not constitute the prior art known to those of ordinary skill in the art.

SUMMARY

An aspect of an exemplary implementation of the present disclosure provides a method of handling a control wafer. The method of handling a control wafer is used for equipment provided with multiple reaction chambers, and the method of handling a control wafer includes: setting different identification numbers for the multiple reaction chambers; determining slot numbers of control wafers according to the identification numbers of the reaction chambers; and distributing the control wafers according to the slot numbers of the control wafers and the identification numbers of the reaction chambers.

An aspect of an exemplary implementation of the present disclosure provides an apparatus for handling a control wafer. The apparatus for handling a control wafer is used for equipment provided with multiple reaction chambers, and the apparatus for handling a control wafer includes: an identification number setting module, for setting different identification numbers for the multiple reaction chambers; a slot number determining module, for determining slot numbers of control wafers according to the identification numbers of the reaction chambers; and a control wafer distributing module, for distributing the control wafers according to the slot numbers of the control wafers and the identification numbers of the reaction chambers.

An aspect of an exemplary implementation of the present disclosure provides a method of testing by using a control wafer. The method of testing by using a control wafer includes: distributing control wafers to reaction chambers by using the method of handling a control wafer; testing in the reaction chambers by using control wafers; and obtaining states of the control wafers after the test, where the states of the control wafers include at least one of a thickness of the control wafers, a bow of the control wafers, an amount of surface particle of the control wafers, a contamination level of the control wafers or a number of uses of the control wafers.

An aspect of the present disclosure provides a computer-readable storage medium. The computer-readable storage medium stores a computer program, where the computer program is executed by a processor to implement the method of handling a control wafer or the method of testing by using a control wafer.

An aspect of the present disclosure provides an electronic device. The electronic device includes a processor and a memory for storing an executable instruction executed by the processor, where the processor is configured to execute the executable instruction so as to implement the method of handling a control wafer or the method of testing by using a control wafer.

It should be understood that the above general description and the following detailed description are only exemplary and explanatory, and should not be construed as a limitation to the present disclosure.

BRIEF DESCRIPTION OF THE DRAWINGS

The drawings incorporated into the specification and constituting part of the specification illustrate the embodiments of the present disclosure, and serve, together with the specification, to explain the principles of the present disclosure. Apparently, the drawings in the following description show merely some embodiments of the present disclosure, and those of ordinary skill in the art may still derive other drawings from these drawings without creative efforts. In the drawings:

FIG. 3 is a first view of an operation interface for the method of handling a control wafer according to an exemplary embodiment of the present disclosure;

FIG. 4 is a second view of the operation interface for the method of handling a control wafer according to an exemplary embodiment of the present disclosure;

DETAILED DESCRIPTION

Figure 1:
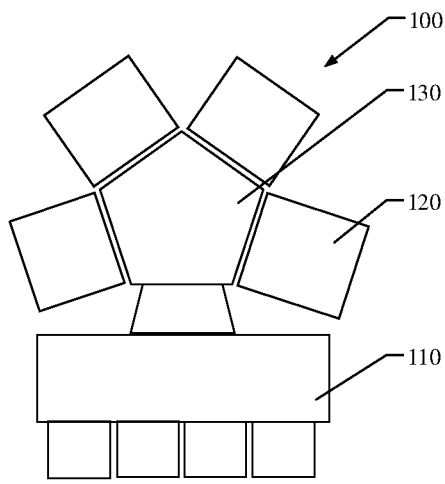
FIG. 1 is a view illustrating a structure of a lithography machine according to an exemplary embodiment of the present disclosure.

Exemplary embodiments will be described more comprehensively below with reference to the drawings. The exemplary embodiments may be implemented in various forms, and may not be construed as being limited to those described herein. On the contrary, these exemplary embodiments are provided to make the present disclosure comprehensive and complete and to fully convey the concept manifested therein to those skilled in the art. The same reference numerals in the figures indicate the same or similar parts, and thus will not be repeatedly described herein.

The described features, structures, or characteristics may be incorporated into one or more embodiments in any suitable manner. The following description offers many specific details in order for a full understanding of the embodiments of the present disclosure. However, those skilled in the art should be aware that the technical solutions of the present disclosure may be practiced with one or more of the specific details omitted, or other methods, components, apparatuses or steps may be used. In other cases, well-known structures, methods, apparatuses, implementations, materials or operations will not be shown or described in detail so as to avoid obscuring various aspects of the present disclosure.

The block views shown in the drawings are merely functional entities, which do not necessarily correspond to physically independent entities. These functional entities may be implemented in the form of software, partially implemented in one or more hardware modules, or implemented in different networks and/or processors and/or microcontrollers.

A variety of semiconductor processing equipment is needed in the semiconductor industry, for example, single crystal furnace, vapor phase epitaxy furnace, oxidation furnace, magnetron sputtering apparatus, chemical-mechanical polishing machine, lithography machine, ion implanter, wire bonding machine, wafer dicing machine, wafer thinning machine, etc. Some of these equipment is usually provided with multiple reaction chambers.

The present disclosure is described by taking a lithography machine as an example. FIG. 1 illustrates a structure of the lithography machine. As shown in FIG. 1, the lithography machine 100 includes a wafer handling system 110, reaction chambers 120 and a transfer chamber 130. There are multiple reaction chambers 120, and the multiple reaction chambers 120 are used to perform different processes on wafers placed in the wafer handling system 110.

In practical applications, in order to monitor the processing of the reaction chambers 120, it is necessary to test the processing of the reaction chambers 120 by using a small amount of wafers as control wafers. The control wafers are subjected to processing in the reaction chambers 120, and the stability of the reaction chambers 120 is analyzed and determined according to processing results, so as to determine whether the reaction chambers 120 are malfunctioning or need maintenance. In this way, a qualified environment can be provided for the general processing of semiconductor wafers and the rejection rate can be reduced.

In order to ensure the accuracy of the test results, each reaction chamber of equipment usually needs to be tested by using multiple control wafers. Therefore, before distributing control wafers to each reaction chamber, it is necessary to count the total number of control wafers required by the equipment, and transport the total number of control wafers to the equipment, such that the equipment can distribute the control wafers.

In actual wafer transportation, a front opening wafer unified pod (FOUP) is usually used to protect, transport and store wafers. Therefore, the FOUP can be used to transport control wafers in a required quantity to the equipment for testing.

After the control wafers are transported to the equipment, the control wafers need to be distributed to different reaction chambers. In practical applications, some reaction chambers have requirements for the thickness or surface particle count of the control wafers. If the thickness or surface particle count of the control wafers is not up to standard, no qualified product will be obtained after processing in the reaction chambers. On the contrary, it will affect the determination of the processing conditions in the reaction chambers, resulting in inaccurate test results. Some reaction chambers may have different contamination levels due to process differences. Reaction chambers of different contamination levels cannot share control wafers. The acceptable contamination levels of the reaction chambers are different. For example, the contamination level for a back-end copper process, the contamination level after exposure and development and the contamination level for a front-end general process are different. If the control wafers are randomly distributed to the reaction chambers of different contamination levels, cross-contamination will be caused between the reaction chambers, and the performance of products obtained subsequently will be affected.

Figure 2:
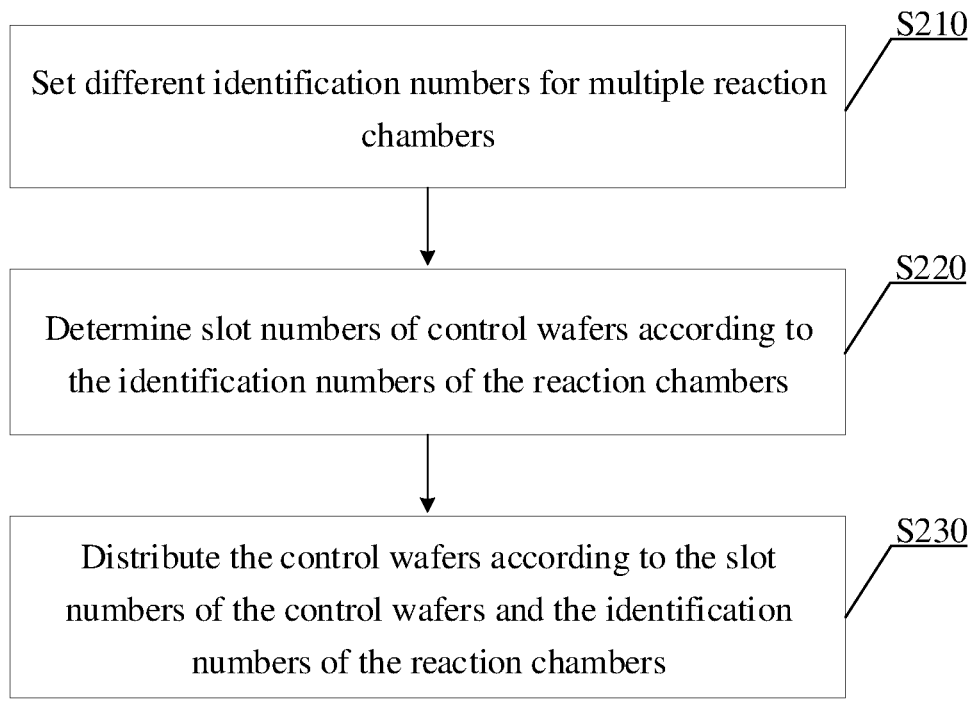
FIG. 2 is a flowchart of a method of handling a control wafer according to an exemplary embodiment of the present disclosure.

Therefore, the reasonable and automatic distribution of the control wafers is a problem to be solved in the present disclosure. FIG. 2 is a flowchart of a method of handling a control wafer according to an exemplary implementation of the present disclosure. As shown in FIG. 2, the method of handling a control wafer is used for equipment provided with multiple reaction chambers, and includes the following steps:

S210: Set different identification numbers for the multiple reaction chambers.

S220: Determine slot numbers of control wafers according to the identification numbers of the reaction chambers.

S230: Distribute the control wafers according to the slot numbers of the control wafers and the identification numbers of the reaction chambers.

In the method of handling a control wafer provided by the exemplary implementation of the present disclosure, reaction chambers are set with different identification numbers, and control wafers are set with corresponding slot numbers according to the identification numbers of the reaction chambers. The control wafers are automatically distributed according to the slot numbers of the control wafers and the identification numbers of the reaction chambers. The present disclosure realizes a method for automatically setting and distributing controls in equipment, which saves manpower and time, reduces the error rate caused by manual operation, and improves the distribution efficiency.

The method of handling a control wafer in the exemplary implementation is further described below.

In S210, different identification numbers are set for the multiple reaction chambers.

In practical applications, semiconductor processing equipment is often provided with multiple reaction chambers. In order to facilitate the distribution of different control wafers to the reaction chambers, different identification numbers are first set for the reaction chambers, so as to facilitate the distribution of the control wafers later.

In S220, slot numbers of control wafers are determined according to the identification numbers of the reaction chambers.

In order to distribute different control wafers to different reaction chambers, in an exemplary implementation of the present disclosure, the slot numbers of the control wafers are determined according to the identification numbers of the reaction chambers. A slot number identification device on the equipment identifies the control wafers according to their slot numbers, and distributes eligible control wafers to corresponding reaction chambers. This step realizes automatic distribution of the control wafers, avoids improper identification or contamination caused by manual operation, and improves distribution efficiency.

In the actual process of determining the slot numbers of the control wafers, it is necessary to first determine whether there is a reaction chamber in the equipment that needs to be distributed with an appointed control wafer, that is, whether there is a reaction chamber that needs to be distributed with a control wafer that satisfies a preset condition. The preset condition may be determined according to the actual conditions of the reaction chamber. For example, the control wafer may be required to have a certain thickness or surface particle count, which is not limited herein.

If there is a reaction chamber to which a control wafer is appointed, the slot number of an eligible control wafer is set as the identification number of the reaction chamber, and the slot number of any other control wafer is set as a sum of the identification numbers of the remaining reaction chambers. This design facilitates the identification of the slot numbers of the control wafers. Here, the reaction chamber needing an appointed control wafer is referred to as a preset appointed reaction chamber, and the corresponding control wafer is referred to as a preset appointed control wafer. If PMi is used to represent the identification number of an i-th reaction chamber, the slot number SNm of the preset appointed control wafer is equal to the identification number PMm of the preset appointed reaction chamber, that is, SNm=PMm. The slot number SNj of any other control wafer is equal to the sum $\Sigma PM_i$ of the identification numbers of all the reaction chambers minus the identification number PMm of the preset appointed reaction chamber. If there are multiple preset appointed reaction chambers, the sum $\Sigma PM^i$ of the identification numbers of all the reaction chambers minus the sum Sum(PMm) of the identification numbers of the multiple preset appointed reaction chambers is the sum of the identification numbers of the remaining reaction chambers, that is $SN_j = \Sigma PM_i - Sum(PMm)$.

If there is no reaction chamber to which a control wafer is appointed, the slot number of a control wafer is set as the sum of the identification numbers of the reaction chambers that do not need an appointed control wafer. That is, if there is no preset appointed reaction chamber, the slot number SNn of the control wafer can be set as the sum of the identification numbers of all the reaction chambers, that is, $SN_n = \Sigma PM_i$, such that the control wafer can be randomly used in any reaction chamber.

In S230, the control wafers are distributed according to the slot numbers of the control wafers and the identification numbers of the reaction chambers.

After the identification numbers of the reaction chambers and the slot numbers of the control wafers are determined, the control wafers can be distributed according to the identification numbers and the slot numbers.

In a specific distribution process, if the slot number of a certain control wafer is exactly equal to the identification number of a reaction chamber, the control wafer is directly distributed to the reaction chamber. That is, the control wafer is appointed to the reaction chamber. This design satisfies the requirement of the preset appointed reaction chamber that needs an appointed control wafer to achieve the purpose of test.

If the slot number of a control wafer is equal to the sum of the identification numbers of multiple reaction chambers, the control wafer is distributed to one of the multiple reaction chambers. In other words, the control wafer can be used in any one of the multiple reaction chambers, and the equipment can randomly distribute the control wafer to satisfy the demand of the reaction chamber for the control wafer.

In order to avoid confusion occurring in the distribution of the control wafers to multiple reaction chambers, in an exemplary implementation of the present disclosure, when the identification numbers of the reaction chambers are set in step S210, three conditions need to be satisfied. A first condition is that the identification numbers of multiple reaction chambers are different.

A second condition is that the sum of the identification numbers of the multiple reaction chambers is not equal to the identification number of any one of the other reaction chambers. That is, in a set of multiple reaction chambers of the same equipment, the sum of the identification numbers of any quantity of reaction chambers is not equal to the identification numbers of the remaining reaction chambers in the set.

A third condition is that the sum of the identification numbers of the multiple reaction chambers is not equal to the sum of the identification numbers of the other reaction chambers in any quantity. That is, in a set of multiple reaction chambers of the same equipment, the sum of the identification numbers of any quantity of reaction chambers is not equal to the sum of the identification numbers of the other reaction chambers in the set.

The above conditions are described below by taking the reaction chambers and their identification numbers shown in Table 1 as an example.

TABLE 1

| Reaction chamber | Identification number $PM_i$ | Hexadecimal |
| --- | --- | --- |
| C1 | 1 | 0x00000001 |
| C2 | 2 | 0x00000002 |
| C3 | 4 | 0x00000004 |
| C4 | 8 | 0x00000008 |
| C5 | 16 | 0x00000010 |
| C6 | 32 | 0x00000020 |

Table 1 shows that the identification numbers of the reaction chambers C1-C6 are different. In addition, the sum of the identification numbers of any two reaction chambers is not equal to the identification number of any one of the remaining four reaction chambers. The sum of the identification numbers of any three reaction chambers is not equal to the identification number of any one of the remaining three reaction chambers. The sum of the identification numbers of any four reaction chambers is not equal to the identification number of any one of the remaining two reaction chambers. The sum of the identification numbers of any five reaction chambers is not equal to the identification number of the sixth reaction chamber. That is, the second condition is satisfied.

The sum of the identification numbers of any two reaction chambers is not equal to the sum of the identification numbers of the remaining four reaction chambers, nor the sum of the identification numbers of the remaining three or two reaction chambers. The sum of the identification numbers of any three reaction chambers is not equal to the sum of the identification numbers of the remaining three reaction chambers, nor the sum of the identification numbers of any other two reaction chambers. The sum of the identification numbers of any four reaction chambers is not equal to the sum of the identification numbers of the remaining two reaction chambers. That is, the third condition is satisfied.

When the identification numbers of the reaction chambers satisfy the above three conditions, the identification numbers of the reaction chambers included in the set slot numbers of the control wafers will not be repeated. For example, when the sum of the identification numbers of the reaction chambers C1 and C2 is equal to the identification number of the reaction chamber C3, then if the slot number of a certain control wafer is exactly equal to the identification number of C3, during the distribution of the control wafer, there will be a logical confusion as to whether the control wafer is distributed to C3 or to any one of C1 and C2. This will result in an distribution error and the distribution will not proceed normally.

It should also be noted that the last column in Table 1 represents a format recognizable by a programming language in which the identification number in the second column is converted to hexadecimal. In practical applications, the identification number may also be converted into other different system to satisfy the recognition requirement of the programming language, such as binary, which is not particularly limited herein.

Further, the distribution process in the exemplary implementation of the present disclosure is described by taking the identification numbers of the reaction chambers shown in Table 1 as an example.

If there are 25 control wafers in an FOUP, SN1-SN25, there are two cases for description. In one case, as shown in Table 2, the 25 control wafers can be appointed to any reaction chamber, and the slot numbers of the control wafers are set as the sum of the identification numbers of all the reaction chambers, that is, $SN=\Sigma PM_i=1+2+4+8+16+32=63$. In the distribution of the control wafers, according to the value of 63, the control wafers SN1-SN25 are randomly distributed to the reaction chambers C1-C6 in the equipment until the demand of the reaction chambers for the control wafers is satisfied.

TABLE 2

| SN1 | SN2 | SN3 | SN4 | SN5 | SN6 | SN7 | SN8 | ... | SN25 |
|---|---|---|---|---|---|---|---|---|---|
| 63 | 63 | 63 | 63 | 63 | 63 | 63 | 63 | ... | 63 |

In the other case, as shown in Table 3, the control wafers SN1-SN5 are appointed to the reaction chamber C2, then according to $SN_m=PM_m$, the slot numbers of SN1-SN5 are 2, and the slot numbers of the remaining control wafers SN6-SN25 are $SN_i=\Sigma PM_i-\text{Sum}(PM_m)=63-2=61$. In the distribution of the control wafers, according to the value of 2, the control wafers SN1-SN5 are distributed to the reaction chamber C2. According to the value of 61, SN6-SN25 are randomly distributed to the reaction chambers C1 and C3-C6.

TABLE 3

| SN1 | SN2 | SN3 | SN4 | SN5 | SN6 | SN7 | SN8 | ... | SN25 |
|---|---|---|---|---|---|---|---|---|---|
| 2 | 2 | 2 | 2 | 2 | 61 | 61 | 61 | ... | 61 |

In another case, as shown in Table 4, when the control wafers SN1-SN5 are appointed to the reaction chamber C2, and the control wafers SN6 and SN7 are appointed to the reaction chamber C5. Then according to $SN_m=PM_m$, the slot numbers of SN1-SN5 are 2, the slot numbers of SN6 and SN7 are 16, and the slot numbers of the remaining control wafers SN8-SN25 are $SN_i=\Sigma PM_i-\text{Sum}(PM_m)=63-2-16=45$. In the distribution of the control wafers, the control wafers SN1-SN5 are distributed to the reaction chamber C2 according to the value of 2, the control wafers SN6 and SN7 are distributed to the reaction chamber C5 according to the value of 16, and SN8-SN25 are randomly distributed to the reaction chambers C1, C3, C4 and C6 according to the value of 45.

TABLE 4

| SN1 | SN2 | SN3 | SN4 | SN5 | SN6 | SN7 | SN8 | ... | SN25 |
|---|---|---|---|---|---|---|---|---|---|
| 2 | 2 | 2 | 2 | 2 | 16 | 16 | 45 | ... | 45 |

The identification numbers of the reaction chambers are required to satisfy these three conditions so as to avoid logical confusion occurring in the distribution of the control wafers. This design provides a basis for automatic distribution of the control wafers.

It should also be noted that, in the exemplary implementation of the present disclosure, to determine a preset appointed control wafer, that is, to determine a control wafer that satisfies a preset condition, the preset appointed control wafer may be determined from multiple control wafers according to states of the control wafers. If the state of a control wafer satisfies the preset condition, the control wafer is determined as a preset appointed control wafer. The state of the control wafer may be at least one of a thickness of the control wafer, a bow of the control wafer, an amount of surface particle of the control wafer, a contamination level of the control wafer or a number of uses of the control wafer. The surface particle counts of the control wafers generally satisfy the preset condition within allowable number of uses. Since reaction chambers with different contamination levels cannot share control wafers, suitable control wafers can be selected as preset appointed control wafers through the contamination levels of the control wafer. According to the historical use data of the control wafers, the states of the control wafers are determined, and then preset appointed control wafers can be automatically distributed to preset appointed reaction chambers, which further avoids manual participation and improves the distribution efficiency of control wafers.

However, in the actual test process of the control wafers, even if the number of uses of a control wafer exceeds an allowable number of uses, the particle count of the control wafer may not exceed the preset condition, that is, the control wafer is eligible for test. In this case, if the control wafer is scrapped only based on the number of uses, it will cause waste. Therefore, in the exemplary implementation of the present disclosure, the preset appointed control wafer may further be manually determined on an operation interface 300 or 400 as shown in FIG. 3 or FIG. 4. That is, the staff can appoint a certain control wafer or several control wafers to a certain reaction chamber on the operation interface, that is, to appoint a preset appointed control wafer to a preset appointed reaction chamber. This design increases the utilization of the control wafer, reduces the waste of resources, and achieves the purpose of saving resources.

Specifically, as shown in FIG. 3, if there is no need to appoint a control wafer to a preset appointed reaction chamber, clicking an automatic distribution button will display that each control wafer can be distributed to any reaction chamber. As shown in FIG. 4, if it is needed to distribute a control wafer to a preset appointed reaction chamber, a manual distribution button can be clicked, for example, to set the identification numbers of the control wafers SN1-SN5 to 2. That is, the appointed reaction chamber corresponding to the control wafers SN1-SN5 is C2, and the appointed reaction chamber of the other control wafers SN6-SN25 may be any of C1 and C3-C6.

When the control wafers complete the test or reach a final use state, it is determined whether to replace the control wafers according to their states. That is, if the states of the control wafers exceed a preset limit, the control wafers are marked and replaced. The specific replacement method will not be described in detail in the exemplary implementation of the present disclosure.

The preset limit may include at least one of a range of the thickness of the control wafer, a range of the bow of the control wafer, a range of the amount of surface particle of the control wafer, a range of the contamination level of the control wafer or a range of the number of uses of the control wafer, which is not particularly limited in the exemplary implementation of the present disclosure.

It should be noted that one FOUP usually contains 25 wafers, then if the number of wafers used on one piece of equipment is less than 25, the remaining wafers can be transported by the FOUP to other equipment for test. The transportation device of the control wafers is not limited to the FOUP, and other transportation device may also be used, which is not particularly limited in the exemplary implementation of the present disclosure.

In addition, the method of handling a control wafer is suitable for control wafer test, as well as wafer distribution during processing and production.

In summary, the reaction chambers are set with identification numbers that satisfy three conditions, the control wafers are set with slot numbers according to the identification numbers, and the control wafers are distributed according to the slot numbers and the identification numbers. The method of handling a control wafer realizes the automatic distribution of the control wafers, thereby improving the distribution efficiency, shortening the manufacturing time, improving the utilization of the control wafers, and saving the labor cost. Especially in mass production, automatic distribution can avoid product contamination caused by manual operation so as to improve the yield. In addition, automatic distribution avoids false marks caused by manual operation during testing or production, thereby ensuring that the control wafers and the recorded data are consistent.

It should be noted that although the various steps of the method of handling a control wafer in the present disclosure are described in a specific order in the drawings, this does not require or imply that these steps must be performed in this particular order, or that all the steps shown must be performed to achieve the desired result. Additionally or alternatively, some steps may be omitted, and multiple steps may be combined into one step for execution, and/or one step may be decomposed into multiple steps for execution, etc.

In addition, this exemplary embodiment further provides an apparatus for handling a control wafer, which is used for equipment with multiple reaction chambers. The apparatus for handling a control wafer refers to the related description of the method of handling a control wafer, such that the embodiment of the apparatus for handling a control wafer can be supported by the specific description related to the method of handling a control wafer embodiment.

Figure 5:
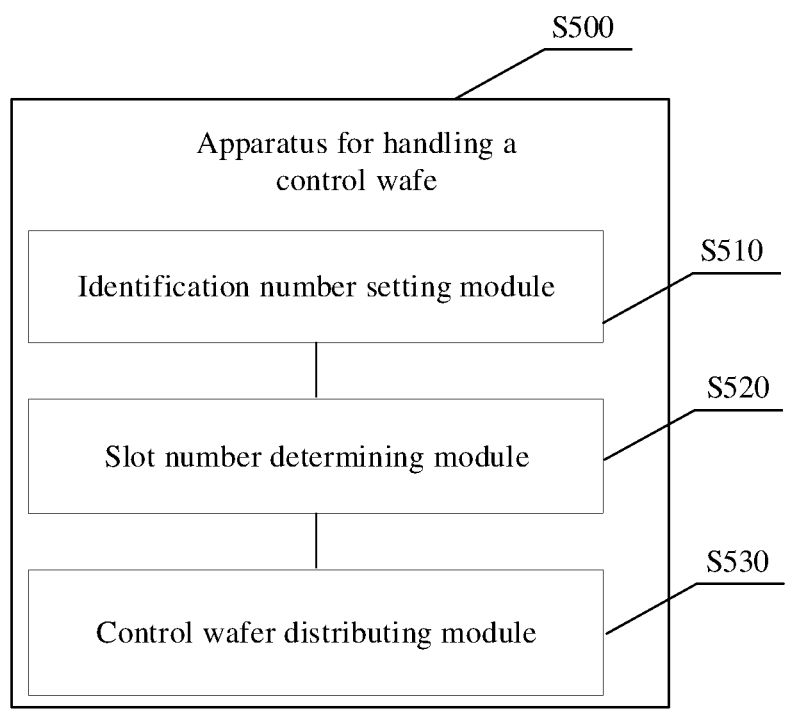
FIG. 5 is a first block view of an apparatus for handling a control wafer according to an exemplary embodiment of the present disclosure.

Referring to FIG. 5, the apparatus for handling a control wafer 500 may include: an identification number setting module 510, a slot number determining module 520 and a control wafer distributing module 530.

The identification number setting module 510 is used to set different identification numbers for the multiple reaction chambers.

The slot number determining module 520 is used to determine slot numbers of control wafers according to the identification numbers of the reaction chambers.

The control wafer distributing module 530 is used to distribute the control wafers according to the slot numbers of the control wafers and the identification numbers of the reaction chambers.

In practical applications, the apparatus for handling a control wafer can be provided in a manufacturing execution system (MES) of the semiconductor processing equipment. The MES is used to manage and control a complex manufacturing environment, record all chip manufacturing processes and a past chip manufacturing history, so as to provide a data basis for controlling wafer distribution.

In some embodiments of the present disclosure, the slot number determining module 520 may include: a calculation sub-module, for setting, when a reaction chamber needs an appointed control wafer, the slot number of a control wafer as the identification number of an appointed reaction chamber, and setting, when no reaction chamber needs an appointed control wafer, the slot number of a control wafer as the sum of the identification numbers of reaction chambers that are not appointed.

In some embodiments of the present disclosure, the control wafer distributing module 530 may be used for: distributing, when the slot number of a control wafer is equal to the identification number of a reaction chamber, the control wafer to the reaction chamber, and distributing, when the slot number of the control wafer is equal to the sum of the identification numbers of the multiple reaction chambers, the control wafer to one of the multiple reaction chambers.

Figure 6:
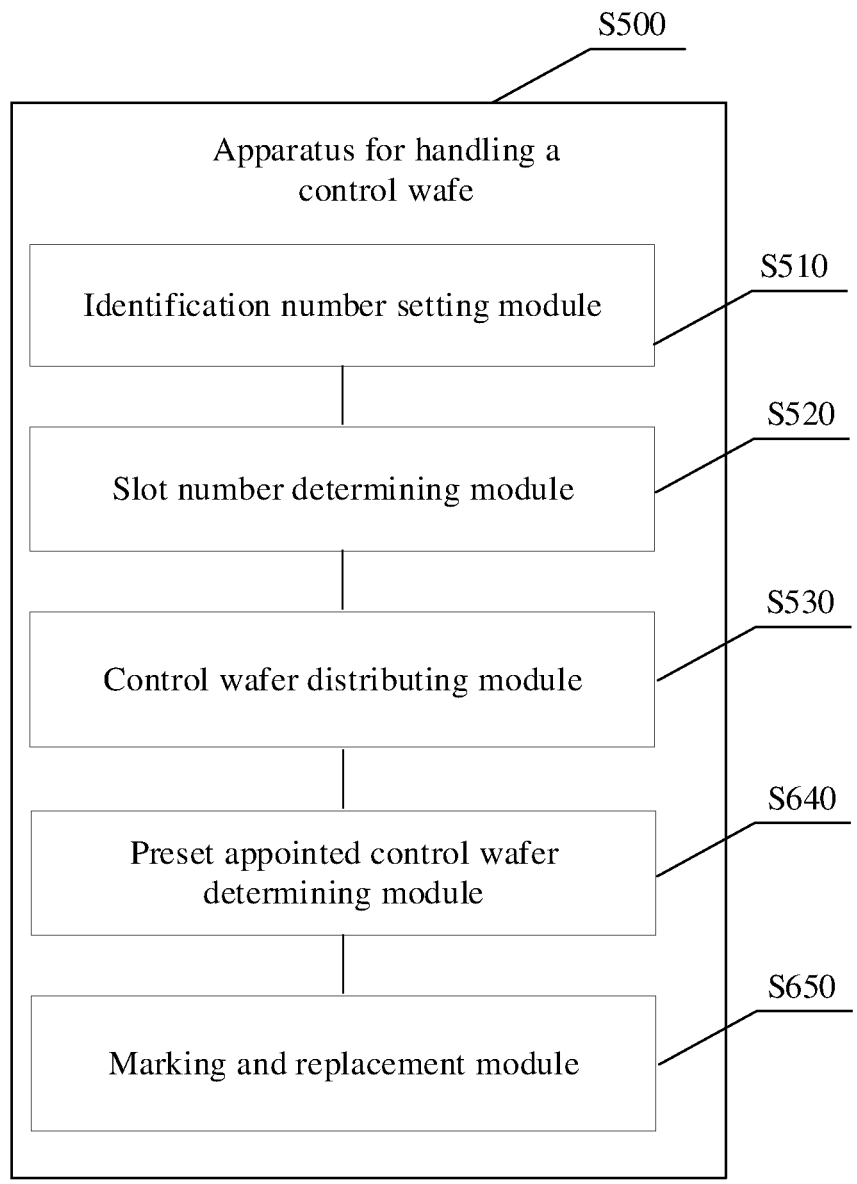
FIG. 6 is a second block view of the apparatus for handling a control wafer according to an exemplary embodiment of the present disclosure.

In some embodiments of the present disclosure, referring to FIG. 6, the apparatus for handling a control wafer 500 further includes: a preset appointed control wafer determining module 640, which may be used for determining, according to states of the control wafers, a preset appointed control wafer from multiple control wafers, or manually determining the preset appointed control wafer. The preset appointed control wafer is distributed to a reaction chamber that appoints the control wafer. The states of the control wafers include at least one of a thickness of the control wafers, a bow of the control wafers, an amount of surface particle of the control wafers, a contamination level of the control wafers or a number of uses of the control wafers.

In some embodiments of the present disclosure, the apparatus for handling a control wafer 500 further includes a marking and replacement module 650, which may be used to mark a control wafer and replace the control wafer if the state of the control wafer exceeds a preset limit. The preset limit includes at least one of a range of the thickness of the control wafer, a range of the bow of the control wafer, a range of the amount of surface particle of the control wafer, a range of the contamination level of the control wafer or a range of the number of uses of the control wafer.

The specific details of each virtual module of the apparatus for handling a control wafer are described in detail in the corresponding method of handling a control wafer, and will not be repeated here.

It should be noted that although several modules or units of the apparatus for handling a control wafer are mentioned in the above description, such division of modules or units is not mandatory. In fact, according to the implementations of the present disclosure, the features and functions of two or more modules or units described above may be embodied in one module or unit. Correspondingly, the features and functions of a module or unit described above may be further divided into multiple modules or units to be embodied.

Figure 7:
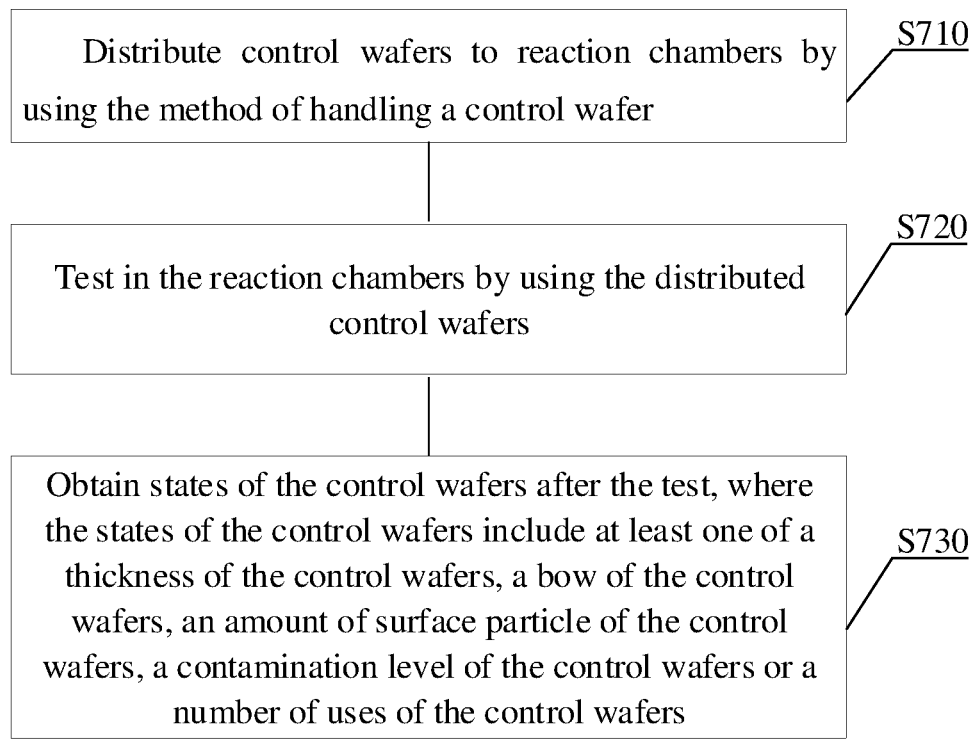
FIG. 7 is a flowchart of a method of testing by using a control wafer according to an exemplary embodiment of the present disclosure.

This exemplary embodiment further provides a method of testing by using a control wafer. Referring to FIG. 7, the method of testing by using a control wafer may include the following steps:

S710: Distribute control wafers to reaction chambers by using the above method of handling a control wafer.

S720: Test in the reaction chambers by using the distributed control wafers.

S730: Obtain states of the control wafers after the test, where the states of the control wafers include at least one of a thickness of the control wafers, a bow of the control wafers, an amount of surface particle of the control wafers, a contamination level of the control wafers or a number of uses of the control wafers.

In the method of testing by using a control wafer provided by this exemplary embodiment, the control wafers are distributed according to the above method of handling a control wafer, which improves the distribution efficiency and accuracy of the control wafers. The working states of the reaction chambers are tested by using the control wafers. The states of the control wafers obtained after the test can be used for the method of handling a control wafer to distribute the control wafers. In this way, a complementary closed-loop operation process is realized, which improves the distribution automation and efficiency of the control wafers in use.

In some embodiments of the present disclosure, the obtaining states of the control wafers after a test may specifically include: obtain manufacturing processes performed in the reaction chambers before and during the test to determine the contamination levels of the control wafers; and count the number of uses of the control wafers after the test; and measure at least one of the thickness of the control wafers, the bow of the control wafers or the amount of surface particle of the control wafers by using a measurement tool. The obtained states of the control wafers can be used to guide the distribution of the control wafers. The specific operation process will not be repeated.

In practical applications, the determination of contamination levels can refer to the following methods. When the control wafers are in an initial state, they are not contaminated, so their contamination levels are relatively low and may be set to 1. When the control wafers undergo certain processes (test processes), such as exposure and development or copper processes, their contamination levels are increased. For example, the contamination level after front-end exposure and development is 2, the contamination level of a general back-end process is 3, the contamination level after back-end exposure and development is 4, and the contamination level of a back-end metal process is 5.

In one case, when the initial contamination level of a control wafer is 1, the contamination level remains unchanged after a general manufacturing process, and it becomes 3 after a general back-end manufacturing process. In the other case, a reaction chamber has recently carried out a front-end exposure process or the contamination level of the control wafer subjected to the process is 2. In both cases, regardless of whether the test process is a general front-end process or a front-end exposure and development process, the contamination level of the control wafer after the test is 2. That is, the higher contamination level is used as the actual contamination level of the control wafer.

An exemplary embodiment of the present disclosure further provides an electronic device for implementing the above method.

Those skilled in the art can understand that various aspects of the present disclosure can be implemented as a system, a method, or a program product. Therefore, various aspects of the present disclosure can be specifically implemented in the following forms, namely: complete hardware implementation, complete software implementation (including firmware, microcode, etc.), or a combination of hardware and software implementations, which can be collectively referred to herein as a "circuit", "module" or "system".

An electronic device 800 according to the implementation of the present disclosure is described below with reference to FIG. 8. The electronic device 800 shown in FIG. 8 is only an example, which should not be construed as any limitation on the function and application scope of the embodiment of the present disclosure.

Figure 8:
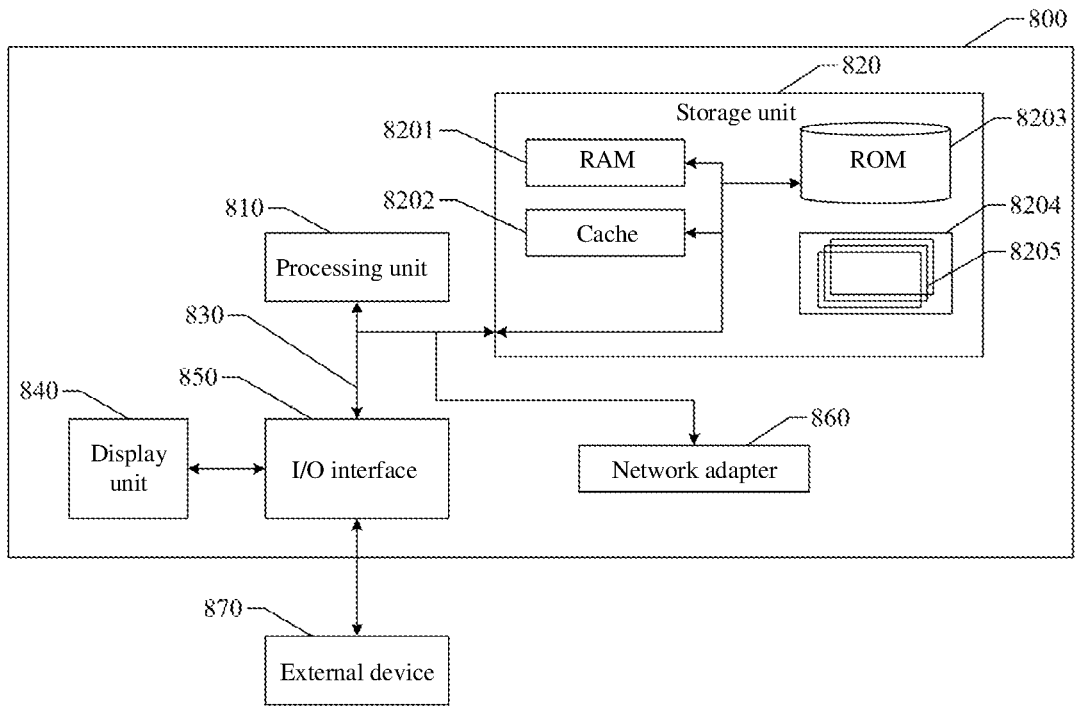
FIG. 8 is a module view of an electronic device according to an exemplary embodiment of the present disclosure.

As shown in FIG. 8, the electronic device 800 is represented in the form of a general-purpose computing device. The components of the electronic device 800 may include but are not limited to: at least one processing unit 810, at least one storage unit 820, a bus 830 connecting different system components (including the storage unit 820 and the processing unit 810), and a display unit 840.

The storage unit 820 stores a program code. The program code may be executed by the processing unit 810, such that the processing unit 810 executes the steps of various exemplary implementations of the present disclosure described in the above exemplary method in this specification. For example, the processing unit 810 may perform the steps shown in FIG. 2: S210: set different identification numbers for the multiple reaction chambers; S220: determine slot numbers of control wafers according to the identification numbers of the reaction chambers; and S230: distribute the control wafers according to the slot numbers of the control wafers and the identification numbers of the reaction chambers. The processing unit 810 may further perform the steps shown in FIG. 7: S710: distribute control wafers to reaction chambers by using the above method of handling a control wafer; S720: test in the reaction chambers by using the distributed control wafers; and S730: obtain states of the control wafers after the test, where the states of the control wafers include at least one of a thickness of the control wafers, a bow of the control wafers, an amount of surface particle of the control wafers, a contamination level of the control wafers or a number of uses of the control wafers.

The storage unit 820 may include a readable medium in the form of a volatile memory, such as a random access memory (RAM) 8201 and/or a cache memory 8202, and may further include a read-only memory (ROM) 8203.

The storage unit 820 may also include a program/utility software 8204 having a set of (at least one) program module 8205. Such a program module 8205 includes but is not limited to: an operating system, one or more application programs, other program modules, and program data. Each or some combination of these examples may include the implementation of a network environment.

The bus 830 may represent one or more of several types of bus structures, such as a storage unit bus or a storage unit controller, a peripheral bus, a graphics acceleration port, a processing unit, or a local bus using any bus structure among multiple bus structures.

The electronic device 800 may also communicate with one or more external devices 870 (for example, a keyboard, a pointing device, a Bluetooth device, etc.). It may also communicate with one or more devices (for example, a router, a modem, etc.) that enable a user to interact with the electronic device 800, and/or communicate with any device that enables the electronic device 800 to communicate with one or more other computing devices. Such communication can be performed through an input/output (I/O) interface 850. In addition, the electronic device 800 may also communicate with one or more networks (for example, a local area network (LAN), a wide area network (WAN), and/or a public network, such as the Internet) through a network adapter 860. As shown in the figure, the network adapter 860 communicates with other modules of the electronic device 800 through the bus 830. It should be understood that although not shown in the figure, other hardware and/or software modules can be used in conjunction with the electronic device 800, including but not limited to: microcode, device drivers, redundant processing units, external disk drive arrays, redundant array of independent drives (RAID), tape drives, data backup storage systems, etc.

Through the foregoing description of the embodiments, persons skilled in the art may easily understand that the exemplary embodiments described herein may be implemented by software, or may be implemented by software in combination with necessary hardware. Therefore, the technical solutions according to the embodiments of the present disclosure may be implemented in a form of a software product. The software product may be stored in a non-volatile storage medium (which may be a compact disk read-only memory (CD-ROM), a universal serial bus (USB) flash drive, a removable hard disk, etc.), and includes a plurality of instructions to cause a computing device (which may be a personal computer, a server, a terminal apparatus, a network device, etc.) to perform the method of handling a control wafer or the method of testing by using a control wafer according to the embodiments of the present disclosure.

An exemplary embodiment of the present disclosure further provides a computer-readable storage medium, which stores a program product for implementing the above method in this specification. In some possible implementations, the various aspects of the present disclosure may also be implemented in the form of a program product, which includes program code. When the program product runs on a terminal device, the program code is used to make the terminal device execute the steps according to various exemplary implementations of the present disclosure described in the above exemplary method in this specification.

The program product for implementing the above method according to the implementation of the present disclosure may adopt a portable CD-ROM and include a program code, and may run on a terminal device, such as a personal computer (PC). However, the program product of the present disclosure is not limited herein. In the present disclosure, the readable storage medium may be any tangible medium that contains or stores a program, and the program may be used by or in combination with an instruction execution system, apparatus, or device.

The program product can use one or any combination of more readable media. The readable medium may be a readable signal medium or a readable storage medium. For example, the readable storage medium may be, but may not be limited to, an electrical, magnetic, optical, electromagnetic, infrared or semiconductor system, apparatus, or device, or any combination thereof. More specific examples (non-exhaustive) of the readable storage medium may include, but are not limited to: an electrical connection with one or more conducting wires, a portable computer disk, a hard disk, an RAM, an ROM, an erasable programmable ROM (an EPROM or a flash memory), an optical fiber, a portable CD-ROM, an optical storage device, a magnetic storage device, or any suitable combination thereof.

The computer-readable signal medium may include a data signal propagated in a baseband or as a part of a carrier, which carries a readable program code. The propagated data signal may be in various forms, including but not limited to an electromagnetic signal, an optical signal, or any suitable combination thereof. The readable signal medium may alternatively be any readable medium other than the readable storage medium. The readable medium may send, propagate, or transmit a program configured to be used by or in combination with an instruction execution system, apparatus, or device.

The program code contained on the readable medium may be transmitted using any suitable medium, including but not limited to: a wireless medium, a wired medium, ab optical fiber, a radio frequency (RF) medium, or any suitable combination thereof.

The program code for performing the operations of the present disclosure can be written in one or any combination of more programming languages. The programming language includes object-oriented programming languages, such as Java, C++, and also includes conventional procedural programming languages, such as "C" language or similar programming languages. The program code may be executed fully on a user's computing device, executed partially on a user's device, executed as an independent software package, executed partially on a user's computing device and partially on a remote computing device, or executed fully on a remote computing device or a server. In a circumstance in which a remote computing device is involved, the remote computing device may be connected to a user's computing device via any type of network, including a LAN or a WAN, or may be connected to an external computing device (for example, connected via the Internet by using an Internet service provider).

In addition, the foregoing drawings are merely schematic illustrations of the processes included in the method of handling a control wafer or the method of testing by using a control wafer according to the exemplary embodiments of the present disclosure, and are not intended for limitation. It is easily understood that the processes shown in the foregoing drawings does not indicate or impose a limit on the chronological sequence of these processes. In addition, it is also easily understood that these processes can be performed synchronously or asynchronously, for example, in a plurality of modules.

Those skilled in the art can readily figure out other embodiments of the present disclosure after considering the specification and practicing the content disclosed herein. The present disclosure is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the claims.

It should be noted that, the present disclosure is not limited to the precise structures described above and shown in the drawings, and can be modified and changed in many ways without departing from the scope of the present disclosure. The scope of the present disclosure is defined by the appended claims.

The invention claimed is:

1. A method of handling a control wafer, wherein the method is used for equipment with multiple reaction chambers, and comprises:
    setting different identification numbers for the multiple reaction chambers;
    determining slot numbers of control wafers according to the identification numbers of the reaction chambers; and
    distributing the control wafers according to the slot numbers of the control wafers and the identification numbers of the reaction chambers.

2. The method of handling a control wafer according to claim 1, wherein the determining slot numbers of control wafers according to the identification numbers of the reaction chambers comprises:
    setting, when there is a reaction chamber to which a control wafer being appointed, the slot number of the control wafer as the identification number of the reaction chamber to which the control wafer being appointed; and
    setting, when there is no reaction chamber to which the control wafer being appointed, the slot number of the control wafer as a sum of identification numbers of reaction chambers to which the control wafer being not appointed.

3. The method of handling a control wafer according to claim 2, wherein the distributing the control wafers according to the slot numbers and the identification numbers comprises:
    distributing, when the slot number of a control wafer is equal to an identification number of a reaction chamber, the control wafer to the reaction chamber; and
    distributing, when the slot number of the control wafer is equal to a sum of the identification numbers of multiple reaction chambers, the control wafer to one of the multiple reaction chambers.

4. The method of handling a control wafer according to claim 2, further comprising:
    determining, according to states of the control wafers, a preset appointed control wafer from multiple control wafers, or manually determining the preset appointed control wafer, wherein the preset appointed control wafer is distributed to the reaction chamber to which the control wafer is appointed; and the states of the control wafers comprise at least one of a thickness of the control wafers, a bow of the control wafers, an amount of surface particle of the control wafers, a contamination level of the control wafers or a number of uses of the control wafers.

5. The method of handling a control wafer according to claim 4, further comprising:
    marking and replacing a control wafer if the state of the control wafer exceeds a preset limit, wherein the preset limit comprises at least one of a range of the thickness of the control wafer, a range of the bow of the control wafer, a range of the amount of surface particle of the control wafer, a range of the contamination level of the control wafer or a range of the number of uses of the control wafer.

6. The method of handling a control wafer according to claim 1, wherein a sum of the identification numbers of the multiple reaction chambers is not equal to the identification number of any one of the other reaction chambers.

7. The method of handling a control wafer according to claim 6, wherein a sum of the identification numbers of the multiple reaction chambers is not equal to a sum of the identification numbers of the other reaction chambers in any quantity.

8. A method of testing by using a control wafer, comprising:
    distributing control wafers to reaction chambers by using the method of handling a control wafer according to claim 1;
    testing in the reaction chambers by using the control wafers; and
    obtaining states of the control wafers after the test;
    wherein, the states of the control wafers comprise at least one of a thickness of the control wafers, a bow of the control wafers, an amount of surface particle of the control wafers, a contamination level of the control wafers or a number of uses of the control wafers.

9. The method of testing by using a control wafer according to claim 8, wherein the obtaining states of the control wafers after the test comprises:
    obtaining manufacturing processes performed in the reaction chambers before the test and during the test, to determine the contamination levels of the control wafers;
    counting the number of uses of the control wafers after the test; and
    measuring at least one of the thickness of the control wafers, the bow of the control wafers or the amount of surface particle of the control wafers by using a measurement tool.

10. A computer-readable storage medium, wherein the computer-readable storage medium stores a computer program, and the computer program is executed by a processor to implement the method of testing by using a control wafer according to claim 8.

11. An electronic device, comprising:
    a processor; and
    a memory for storing an executable instruction executed by the processor;
    wherein, the processor is configured to execute the executable instruction to implement the method of testing by using a control wafer according to claim 8.

12. A computer-readable storage medium, wherein the computer-readable storage medium stores a computer program, and the computer program is executed by a processor to implement the method of handling a control wafer according to claim 1.

13. An electronic device, comprising:
a processor; and
a memory for storing an executable instruction executed by the processor;
wherein, the processor is configured to execute the executable instruction to implement the method of handling a control wafer according to claim 1.

14. An apparatus for handling a control wafer, wherein the apparatus is used for equipment with multiple reaction chambers, and comprises:
an identification number setting module, for setting different identification numbers for the multiple reaction chambers;
a slot number determining module, for determining slot numbers of control wafers according to the identification numbers of the reaction chambers; and
a control wafer distributing module, for distributing the control wafers according to the slot numbers of the control wafers and the identification numbers of the reaction chambers.

15. The apparatus according to claim 14, wherein the slot number determining module comprises:
a calculation sub-module, for setting, when there is a reaction chamber to which a control wafer being appointed, the slot number of the control wafer as the identification number of the reaction chamber to which the control wafer being appointed; and setting, when there is no reaction chamber to which the control wafer being appointed, the slot number of the control wafer as a sum of the identification numbers of reaction chambers to which the control wafer being not appointed.

16. The apparatus according to claim 15, wherein the control wafer distributing module is used for distributing, when the slot number of a control wafer is equal to an identification number of a reaction chamber, the control wafer to the reaction chamber; and distributing, when the slot number of the control wafer is equal to a sum of the identification numbers of multiple reaction chambers, the control wafer to one of the multiple reaction chambers.

17. The apparatus according to claim 15, further comprising:
a preset designated control wafer determining module, for determining, according to states of the control wafers, a preset appointed control wafer from multiple control wafers, or for manually determining the preset appointed control wafer; wherein the preset appointed control wafer is distributed to a reaction chamber to which the control wafer being appointed; and the states of the control wafers comprise at least one of a thickness of the control wafers, a bow of the control wafers, an amount of surface particle of the control wafers, a contamination level of the control wafers or a number of uses of the control wafers.

18. The apparatus according to claim 17, further comprising:
a marking and replacement module, for marking and replacing a control wafer if the state of the control wafer exceeds a preset limit, wherein the preset limit comprises at least one of a range of the thickness of the control wafer, a range of the bow of the control wafer, a range of the amount of surface particle of the control wafer, a range of the contamination level of the control wafer or a range of the number of uses of the control wafer.

* * * * *